United States Patent [19]

McConnell et al.

[11] Patent Number: 4,633,893
[45] Date of Patent: Jan. 6, 1987

[54] APPARATUS FOR TREATING SEMICONDUCTOR WAFERS

[75] Inventors: Christopher F. McConnell, Gulph Mills; Alan E. Walter, Exton, both of Pa.

[73] Assignee: CFM Technologies Limited Partnership, Penllyn, Pa.

[21] Appl. No.: 747,894

[22] Filed: Jun. 24, 1985

Related U.S. Application Data

[63] Continuation-in-part of Ser. No. 612,355, May 21, 1984, Pat. No. 4,577,650.

[51] Int. Cl.$^4$ .............................................. B08B 3/04
[52] U.S. Cl. ..................... 134/95; 134/102; 134/114; 134/201; 366/338
[58] Field of Search ................. 134/25.4, 25.5, 26, 134/30, 33, 34, 59, 84, 88, 89, 92, 95, 102, 114, 115 R, 155, 158, 201; 354/315, 325, 326, 337, 340, 344; 118/428, 500, 733; 206/454, 509; 211/41; 156/345; 220/4 C, 4 D; 366/336, 337, 338, 339

[56] References Cited

U.S. PATENT DOCUMENTS

| | | | |
|---|---|---|---|
| 1,040,463 | 10/1982 | Tokheim . | |
| 2,706,992 | 4/1955 | Friedman et al. | 134/140 |
| 2,959,151 | 11/1960 | Ehrlich | 118/429 |
| 2,961,354 | 11/1960 | Cleveland | 134/1 |
| 3,276,458 | 10/1966 | Iversen et al. | 134/57 |
| 3,285,458 | 11/1966 | Wojciechowski | 220/4 |
| 3,343,812 | 9/1967 | Moulton | 259/2 |
| 3,392,780 | 7/1968 | Brown | 118/429 |
| 3,443,991 | 5/1969 | Kremm | 134/3 |
| 3,469,686 | 9/1969 | Gutsche et al. | 206/65 |
| 3,487,948 | 1/1970 | Haidegger | 211/71 |
| 3,534,862 | 10/1970 | Shambelan | 211/41 |
| 3,595,252 | 7/1971 | Conte | 134/109 |
| 3,632,462 | 1/1972 | Barrington | 156/345 |
| 3,746,022 | 7/1973 | Fillion et al. | 134/141 |
| 3,760,822 | 9/1973 | Evans | 134/99 |
| 3,826,377 | 7/1974 | Bachmann | 211/41 |
| 3,834,349 | 9/1974 | Dietze et al. | 118/500 |
| 3,870,033 | 3/1975 | Faylor et al. | 126/360 |
| 3,877,134 | 4/1975 | Shanahan | 29/417 |
| 3,923,156 | 12/1975 | Wallestad | 206/454 |
| 3,926,305 | 12/1975 | Wallestad | 206/73 |
| 3,998,333 | 12/1976 | Kamada | 211/41 |
| 4,015,615 | 4/1977 | Weber et al. | 134/196 |
| 4,039,357 | 8/1977 | Bachmann et al. | 148/175 |
| 4,077,416 | 3/1978 | Johnson, Jr. et al. | 134/159 |
| 4,111,715 | 9/1978 | Sprengling et al. | 134/10 |
| 4,132,567 | 1/1979 | Blackwood | 134/1 |
| 4,153,164 | 5/1979 | Hofmeister et al. | 211/41 |
| 4,197,000 | 4/1980 | Blackwood | 354/323 |
| 4,228,902 | 10/1980 | Schulte | 211/41 |
| 4,235,650 | 11/1980 | Chang et al. | 148/189 |
| 4,246,101 | 1/1981 | Selby, III | 210/615 |
| 4,256,229 | 3/1981 | Lee | 211/41 |
| 4,280,912 | 7/1981 | Berry, III et al. | 210/662 |
| 4,282,825 | 8/1981 | Nagatomo et al. | 118/58 |
| 4,286,541 | 9/1981 | Blackwood | 118/52 |
| 4,318,749 | 3/1982 | Mayer | 134/25.4 |
| 4,321,654 | 3/1982 | Nakajo et al. | 361/396 |
| 4,328,081 | 5/1982 | Fazlin | 204/192 |
| 4,358,470 | 11/1982 | Rasmussen | 427/4 |
| 4,383,884 | 5/1983 | Rozmus | 156/642 |
| 4,395,348 | 7/1983 | Lee | 252/143 |
| 4,479,849 | 10/1984 | Frantzen | 156/640 |

FOREIGN PATENT DOCUMENTS

| | | |
|---|---|---|
| 1282363 | 7/1972 | United Kingdom . |
| 1298006 | 11/1972 | United Kingdom . |
| 1308790 | 3/1973 | United Kingdom . |
| 1385730 | 2/1975 | United Kingdom . |

OTHER PUBLICATIONS

Book of Semi Standards, "Semi Specification-3", 100 mm, and 125 mm Plastic and Metal Wafer Carriers," pp. 1-9, vol. 2.
Equipment Division, Semiconductor Equipment and Materials Institute, Inc., Semi 1983.
Chemineer Kenics brochure, "Kenics Static Mixers," pp. 1-11, Chemineer, Inc.
Koch Engineering Company, Inc. brochure, "Efficient, Maintenance-Free, In-Line Motionless Mixers," and "Our High-Capacity, Low-Pressure-Drop Dumped Packings."
Komax Systems, Inc. brochure, "Simultaneous Division, Cross-Current and Back-Mixing."

Primary Examiner—Philip R. Coe
Attorney, Agent, or Firm—Lahive & Cockfield

[57] ABSTRACT

An improved apparatus for enclosed flow-line semiconductor wafer treatment includes a wafer-containing vessel and a mechanism for imparting plug-flow to a treatment fluid flowing into the vessel. One plug-flow imparting mechanism includes a flow-expansion input element and a fixed helical flow-diverting surface. Another mechanism incorporates a rotating flow diverting surface.

17 Claims, 12 Drawing Figures

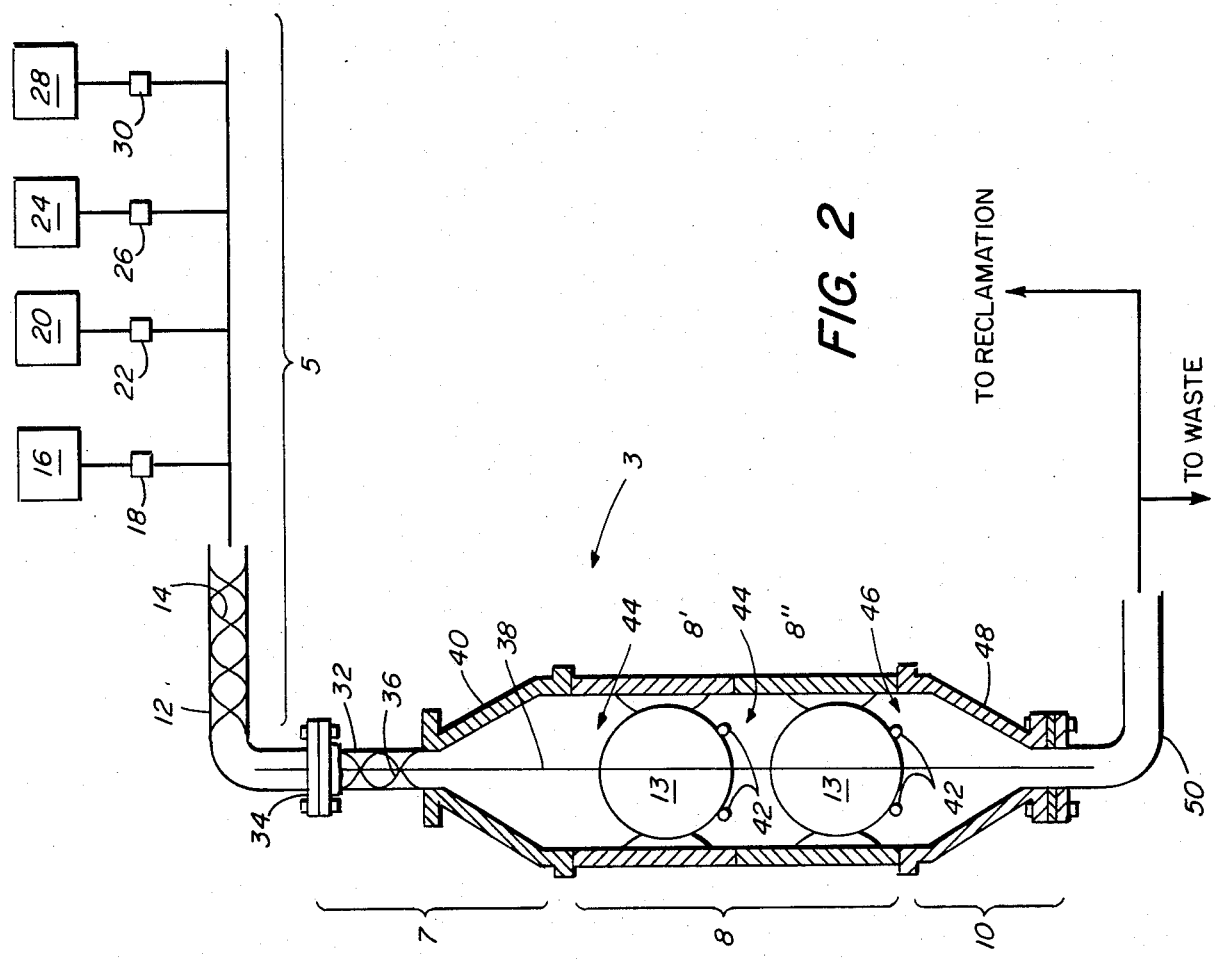
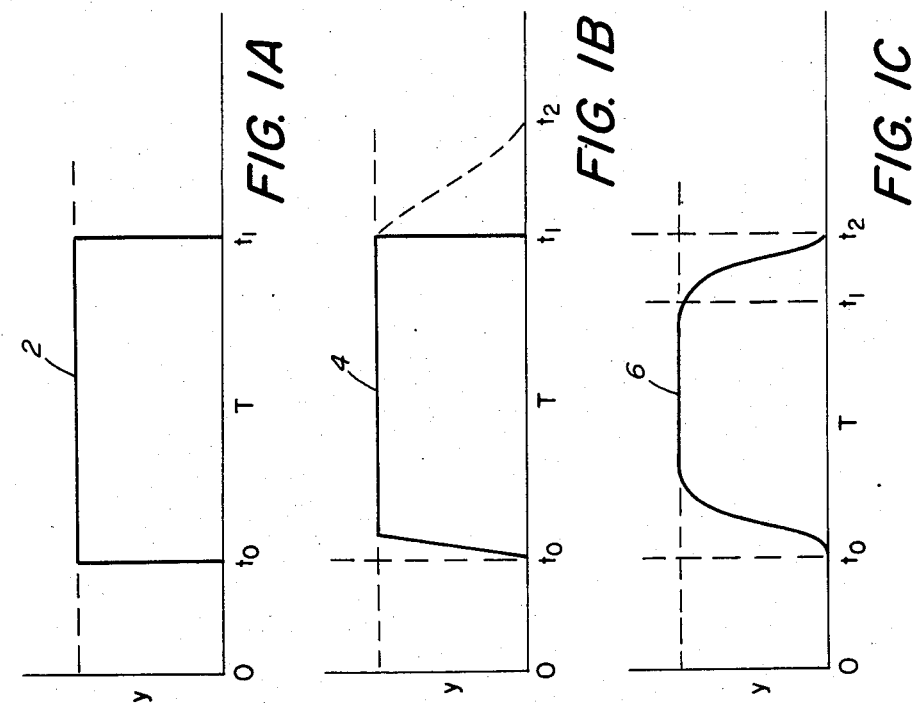

APPARATUS FOR TREATING SEMICONDUCTOR WAFERS

REFERENCE TO RELATED APPLICATIONS

This application is a continuation-in-part of co-pending application Ser. No. 612,355, filed May 21, 1984 for "Method for Treating Wafers with Fluids", and now U.S. Pat. No. 4,577,650 the disclosure of which is incorporated herein by reference.

BACKGROUND OF THE INVENTION

This invention relates to semiconductor fabrication. More particularly, it relates to an improved apparatus for the treatment of semiconductor wafers with fluids.

In the process of fabricating semiconductor wafers, the need to avoid contamination by impurities takes on critical importance. Many of the steps require that the wafer in process be exposed to a fluid, e.g., an oxidizing agent, etchant, or a washing or rinsing agent. To achieve acceptable semiconductor yields, it is important that each of these steps be carried out so as to minimize the potential for contamination.

For example, the diffusion step in semiconductor processing is intended to "drive-in" desired dopant atoms. Any contaminants left on the wafer surface after pre-diffusion cleaning may also be driven into the wafer and can result in a product having faulty electrical properties.

Pre-diffusion cleaning conventionally is accomplished by loading the wafers into a "basket" or wafer carrier such as those described in U.S. Pat. Nos. 3,923,156 and 3,926,305, and then immersing the wafers in the basket in a series of open sinks or tank baths. Usually, the cleaning method involves contacting the wafers first with a strong oxidizing agent, such as sulfuric acid, rinsing with water, contacting the wafers with an etchant such as hydrofluoric acid, and then rinsing again.

Conventional open bath processing systems pose a number of problems. For example, in moving the wafers from the etchant tank to the dump-rinser tank, drops of etchant adhere to the wafers, and during the brief but significant time between tanks, localized etching can occur. With the micron-size dimensions typical of semiconductor fabrication, such minor discrepancies can have a major impact on the yield and performance of integrated circuits.

The so-called "clean rooms" in which open bath processing is performed contain a variety of contaminant sources. Contaminants can originate from human contact, solvent residues and oils from various operations, metals, dust particles, organics and other materials present in processing reagents and in air. Impurities arising from these sources can and do contaminate the reagents and rinse water, leading to reduced semiconductor yields. Further, open baths mounted in countertops pose significant safety problems to technicians who may be exposed to active reagents or their fumes.

The above-mentioned co-pending application Ser. No. 612,355 discloses a substantial improvement in the art of semiconductor wafer processing. That application discloses an enclosed treatment system in which wafers are placed in a vessel which is connected as an integral part of a treatment fluid flow line. The system permits efficient pre-diffusion cleaning and reduces the risk of both wafer contamination and worker exposure to harmful processing fluids.

In the disclosed flow line treatment system of co-pending application, Ser. No. 612,355, liquids entering the vessel through the inlet element to displace another tend to flow directly into the central, wafer-containing volume with unpredictable swirling currents. Each wafer can act as a baffle by at least temporarily inhibiting an adjacent volume of processing fluid from contacting other wafers. Consequently, the innermost wafers can receive greater exposure with a resulting small but significant nonuniformity in the extent of treatment of wafers within a batch, and lack of repoducibility from batch to batch.

It is an object of this invention to provide an improved semiconductor wafer treatment system. More particularly, an object of the invention is to provide an enclosed wafer processing system which reduces risk of contaminant introduction and worker injury, while, simultaneously, providing uniform, reproducible exposure of wafers to various treatment fluids. Another object is to provide an enclosed semiconductor wafer processing system in which treatment fluids are introduced into the vessel in a manner which improves yield.

Other objects of the invention will be evident from the description below.

SUMMARY OF THE INVENTION

It has now been discovered that a simple, efficient system for treating semiconductor wafers with fluids resides in combining an enclosed vessel for containing wafers with specially designed input element. The input element is designed to impart plug-flow to a liquid introduced into the vessel to displace another. As used herein, the term "plug-flow" refers to a liquid flow having a front, transverse to the direction of flow, defined by a generally disc-shaped volume of liquid which contains a concentration gradient produced by the mixing of the two liquids at their interface. The concentration gradient of the front is thinner than the length of the flow path through the vessel. During displacement of liquid contained in the vessel with a different liquid, the front moves along an axis extending between the vessel inlet and vessel outlet, and may expand slightly in thickness, resulting in uniform displacement. This is to be contrasted with non plug-flow displacement wherein the introduction of a liquid produces a narrow stream which creates swirling currents and random mixing during transition of liquids within the vessel.

A treatment apparatus constructed in accordance with the invention can increase the semiconductor yield attained using an enclosed semiconductor wafer treatment vessel because the apparatus achieves more reproducible and more uniform treatment of all wafers within the vessel.

In one aspect, the invention provides an apparatus for treating semiconductor wafers comprising an enclosure defining a wafer-containing vessel, and a fluid input element comprising an element for imparting plug-flow to a liquid passed into the vessel to displace another. The wafer-containing vessel includes an internally disposed wafer support element for holding wafers during the treatment process or structure for supporting a conventional wafer carrier. Preferably, the input element includes a flow expander which increases the cross-sectional flow area of a liquid introduced into the wafer-containing vessel. That is, a fluid flow having a relatively small cross-sectional area entering the flow-expander exits the expander having a larger cross-sectional area, typically of the same dimensions as the vessel. The expander is employed in combination with a flow-diverting surface disposed upstream for imparting to the liquid a flow vector transverse to the direction of flow. In one embodiment, this flow diverting surface is a fixed surface, preferably in the form of a helix extending 360° about an axis disposed in the direction of flow. Alternatively, the surface may comprise a helix or other shape disposed for rotation about the axis. By controlling the rotational velocity of the helix, plug-flow can be maintained despite variations in fluid viscosity, density, and flow rates. The best use of a rotating flow diverter is with more rapidly flowing liquids such as hydrofluoric acid.

In another embodiment, the flow diverting surface consist of one or more fixed, perforated baffles which are secured to the expander upstream of the vessels. The baffle or baffles may be used either with or without an associated helical flow diverting surface.

The invention also provides a method of exposing the radial surfaces of a plurality of semiconductor wafers to a treatment solution, e.g., hydrofluoric acid solution, such that all regions of the radial surfaces of each wafer are exposed to substantially the same concentrations of solution for substantially the same time interval. The method includes the steps of disposing the wafers in an enclosure defining a solution inlet and a solution outlet, introducing a first liquid into the enclosure, inducing plug flow of the treatment solution along an axis extending between the vessel inlet and outlet to displace the first liquid and, after a selected time, inducing plug flow of a second liquid along the same axis to displace the solution. Preferably, the plug flows are induced by passing the liquids through an input element which includes an expander and a flow diverting surface of the type described above.

The operational advantages of the method and apparatus constructed in accordance with the invention result from the action of the plug-flow imparting structure. The plug-flow imparting element permits uniform displacement of the first liquid by the second in a manner analogous to the displacement of the liquid content of a syringe by the syringe plunger. That is, after passing the plug-flow imparting element, the treatment liquid enters the vessel, evenly displaces the first liquid, and pushes it out of the vessel.

It should be understood that the displacement action of the liquid being introduced on the liquid within the vessel is less well defined than the action of a syringe plunger on the syringe fluid content. Rather, input of the second treatment liquid is understood to result in a narrow front containing a concentration gradient which moves along the interior of the vessel in a downstream direction, i.e., in the direction from the inlet of the vessel to the outlet. The front spans the cross-section of the interior of the vessel transverse to the direction of flow.

An apparatus as described above is incorporated into a line for carrying fluids for semiconductor treatment. The line is fitted with one or more valves or the like for temporarily interrupting and changing fluid flow. Wafers may then be loaded into the vessel, and the vessel may be sealed in line. Such a system can permit hydraulically full, high flow circulation. It can also assure uniform, full contact wetting, reduce reagent consumption, prevent back eddying of impurities and filming effects during etching, lead to more consistent localized acid concentrations, and generally result in more consistent, uniform treatment of wafers and improved semiconductor yields. Furthermore, because the operation is totally enclosed, the intrusion of airborne contaminants and carbon dioxide is essentially eliminated, and the danger of operator exposure to dangerous chemicals is minimized. Such treatment stations may be used to conduct pre-diffusion cleaning, rinsing, etching and other batch operations including drying. Furthermore, use of the invention decreases handling and permits tight control of treatment time, temperature, and end-point conductivity of rinse solutions.

BRIEF DESCRIPTION OF THE DRAWING

FIGS. 1A, 1B, and 1C are graphs of reagent concentration over a semiconductor wafer surface vs. time illustrating the reproducibility achievable with the apparatus and process of the invention;

FIG. 2 schematically illustrates one embodiment of the invention incorporating a helical flow diverting surface and an expander;

Like reference characters in the respective drawn figures indicate corresponding parts. Some of the dimensions of the elements illustrated in the drawing have been exaggerated for clarity of explanation.

DESCRIPTION

Figure 3A:
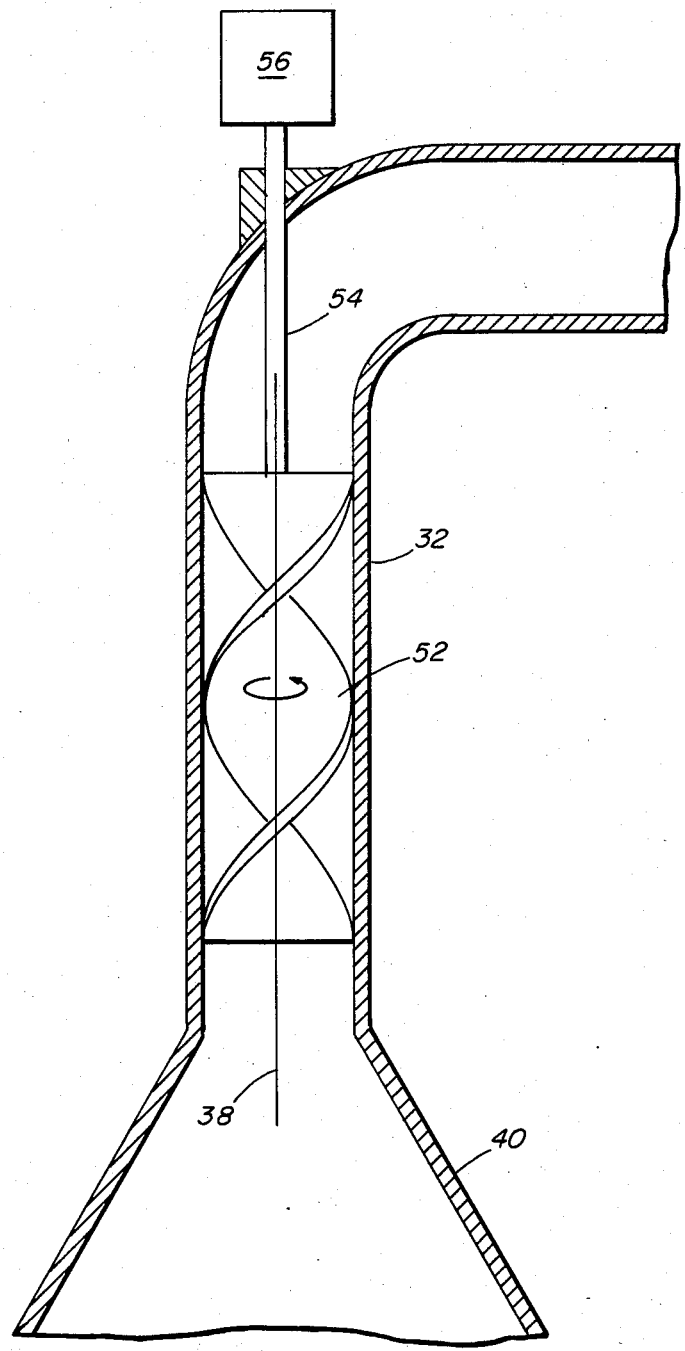
FIG. 3A is a detailed, partly schematic, cross-sectional view of a flow diverting surface mounted for rotation.

FIGS. 1A, 1B, and 1C depict the time-dependent reagent concentration level over a semiconductor wafer surface during an exemplary semiconductor wafer processing stage conducted by an idealized method (1A), a conventional method (1B), and the method of the invention (1C).

The exemplary processing stages depicted in each of the graphs are equivalent and correspond, for example, to a hydrofluoric acid etching stage, or a purified water rinsing stage. The time-dependent concentration curves 2, 4, and 6 have in common a rapidly rising left-side, which corresponds to a treatment reagent immersion phase. Further, each of the curves 2, 4, and 6 have a falling right-side, which corresponds to a treatment reagent extraction phase. The areas under the graphs are representative of the amount of exposure of a wafer surface to the reagent during the treatment stage.

In the ideal wafer treatment method presented in graph 1A, the entire wafer surface is immersed at once in the processing reagent during the immersion phase, and the reagent is removed or extracted at once from the entire wafer surface during the extraction phase. Stated another way, the immersion and extraction phases are of zero duration and are substantially uniform. In this idealized process, the entire surface of each wafer would be exposed to the same reagent concentration for the same time.

Curve 4 of graph 1B depicts the time dependent reagent concentration at the surface of a wafer of a conventional wet bath processing system. Unlike the ideal wafer processing system depicted in graph 1A, the left-side segment of the curve 4, which corresponds to the immersion phase, is not vertical. Rather, the immersion phase corresponds to the time period between the moment when a leading edge of a wafer contacts the processing reagent bath and the moment when the trailing edge is finally immersed. The slope and shape of the curve representing the immersion phase will differ from batch to batch unless the immersion is conducted by robotic control or otherwise standarized.

The right-side segment of the curve 4 corresponds to the extraction phase of a wet bath processing stage. Between the moment at which the extraction phase commences, i.e., at time $t_1$, and the moment when the surface-averaged concentration reaches zero, i.e., at time $t_2$, varying portions of the wafer surface are exposed to varying levels of reagent concentration. Reagent adheres to various portions of the wafers in an unpredictable manner, and the treatment continues in some fashion until all reagent is removed. The extraction curve therefore necessarily varies from batch to batch, and different sections of individual wafers within a batch are exposed to a slightly different treatment. Accordingly, the wet bath treatment method produces non-uniformally treated wafers, thereby reducing yield. Furthermore, unless the process is robotically manipulated, there exists significant uncertainty in the precision of the process-time duration.

Curve 6 of graph 1C represents the surface-average time dependent reagent concentration attained by the method and processing system constructed in accordance with the invention. As above, the left-side segment of the curve 6 corresponds with the immersion phase of the system, while the right-side of the curve 6 corresponds with the extraction phase of the system. More particularly, the left-side segment of curve 6 corresponds to the time period between the moment when the leading edge of the front of liquid being introduced contacts a leading edge of a wafer, i.e., $t_o$, and the moment when the trailing edge of the front passes the trailing edge of the wafer. The right-side segment of curve 6 corresponds to the time period transpiring between the moment, $t_1$, when the leading edge of the front of a second liquid contacts the leading edge of the wafer, and the moment, $t_2$, when the trailing edge of the front passes the trailing edge of the wafer. Note that the immersion and extraction phases of the system are more symmetrical. Using automated apparatus as disclosed herein, the curve can be made highly reproducible, with the result that each wafer in each batch is contaced with substantially the same total amount of reagent for substantially the same amount of time.

FIG. 2 illustrates an embodiment of the invention which can treat plural batches of wafers so as to obtain the effect set forth in FIG. 1C. Broadly, the system 3 comprises, a treatment liquid supply section 5, a liquid input element 7, a pair of wafer vessels 8, and a treatment fluid outlet section 10.

The schematically illustrated, exemplary treatment fluid supply section 5 comprises elements permitting selective introduction of homogeneous treatment fluids to the wafer vessels 8. In particular, the supply section 5 includes a treatment fluid supply line 12 which contains a conventional static mixer 14 which is fed by a plurality of alternately useable reservoirs of fluid. The fluid reservoirs can include, for example, a reservoir of hot sulfuric acid 16 and an associated valve 18, a reservoir of pressurized nitrogen 20 and associated valve 22, a reservoir of an etchent 24, e.g., hydrofluoric acid, and its associated valve 26, and a reservoir of ultrapure water 28 and its associated valve 30. It is contemplated that HF and ultrapure water may be mixed in line, and that a homogeneous solution of controlled HF concentration be supplied to the wafer vessels 8 through the action of static mixer 14. It should be understood that the arrangement and design of the illustrated fluid supply section are not per se a part of the invention.

The fluid input section 7 comprises a section of piping 32 mated with supply line 12 by means of connector 34. Disposed within piping 32 is a fixed, helical, flow-diverting surface 36 disposed 360° about an axis 38 extending in the direction of fluid flow. A flow expander 40 serves to increase the area of fluid flow transverse to the direction of axis 38. The flow diverting surface 36, in combination with the expander 40, serves to impart plug flow to liquids introduced into wafer vessels 8 which are to displace a liquid the vessels already contain. Thus, helical surface 36 imparts to liquids passing therealong a flow vector transverse to axis 38. This has the effect of widening the front surface of liquid flow as the expander is filled. Liquid contained in the vessel is accordingly displaced as a wave or front defined by the interface zone of the newly introduced and the displaced liquid. If the two liquids are miscible, as the front advances mixing occurs within a disc-shaped volume which gets thicker as displacement continues. However, for a given flow rate and a given pair of liquids, the transition is reproducible from batch to batch and results in all radial surfaces of all wafers being exposed to substantially the same amount of active solute or the same rinsing action for the same amount of time.

In one embodiment of the invention, the helical flow-diverting surface 36 is disposed within piping 32 such that its longitudinal axis is aligned with the fluid flow axis 38. The helical surface of element 36 is preferably rotated at least 360° about the longitudinal axis. The length of the element 36 may be 3.5 inches; and the radius may be 1.25 inches. The piping 32 in which element 36 resides may have an inside diameter of 1.375 inches.

Figure 3B:
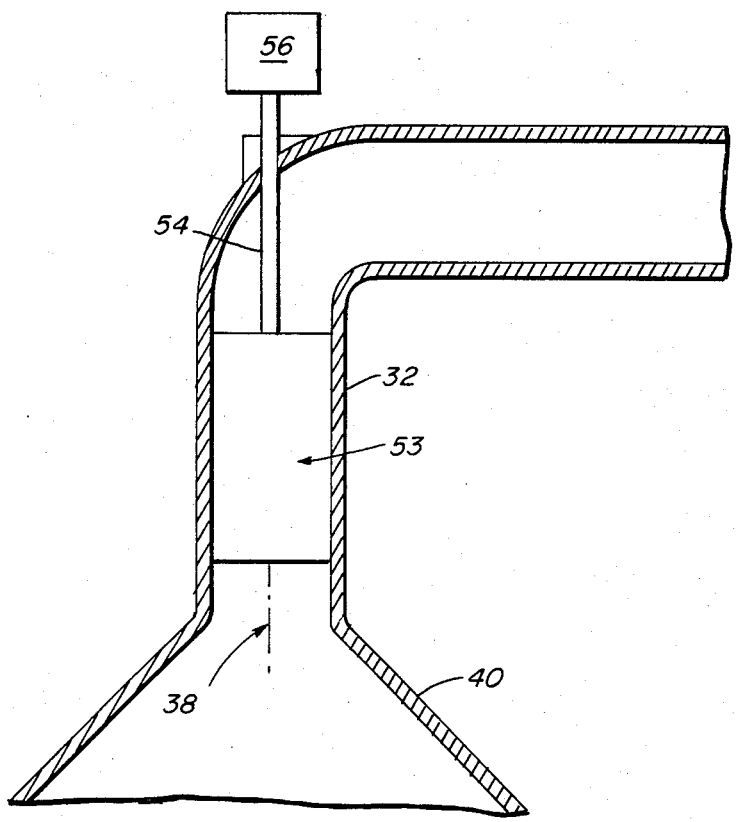
FIG. 3B is a detailed, partly schematic, cross-sectional view of another embodiment of a flow diverting surface mounted for rotation.

In another embodiment of the invention, the fixed flow-diverting surface of FIG. 2A is replaced by a rotatable flow-diverting surface, e.g., a helical structure of the type illustrated in FIG. 3A or a structure such as the flat plate 53 illustrated in FIG. 3B. Structure 52 or 53 is disposed within piping section 32, and mounted for rotation about the axis 38 on shaft 54. The structure 52 of FIG. 3A comprises a blade having a radius sufficient to fit snugly within the piping section 32, and a length sufficient to extend 360°. The plate 53 of FIG. 3B likewise has a width sufficient to fit snugly within piping section 32. The length of plate 53 is not critical; however, it should be sufficient to impart plug flow to liquids passing through piping section 32.

In operation, the structure 52 or 53 is driven by a variable speed motor 56, to achieve rotation about the fluid-flow axis 38. The rotational speed may be varied with the fluid flow rate and the viscosity and density of the liquid being introduced to attain consistent expanding flow in the expander 40. The correct speed of rotation can readily be determined empirically for a given set of flow conditions and a given system geometry.

Figure 3C:
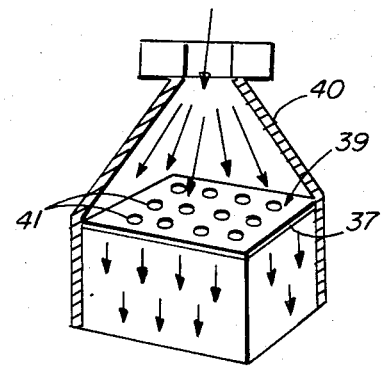
FIG. 3C illustrates another embodiment of the invention incorporating a fixed, perforated baffle as the flow diverting surface.

In another embodiment of the invention, the flow diverting surface takes the form of a perforated baffle 39 as illustrated in FIG. 3C. The baffle 39 is disposed adjacent the output portion of expander 40 mounted to its interior walls. Baffle 39 comprises a flat, plate-like structure 37 having a plurality of generally circular or ovoid perforations 41. The number of perforations 41 and their dimensions will vary depending upon the fluid being passed through the expander 40, the fluid flow rate, and the dimensions of the system. These variables can easily be determined by one skilled in the relevant art.

The use of baffle 39 may achieve essentially the same result as the use of the alternative embodiments of this invention such as flow diverting surface 36 and structures 52 and 53. It is possible to use baffle 39 either with or without surface 36 or structures 52 or 53.

In a preferred practice, the helical flow diverting surface 36 is a fixed helix. The radius of the helix is only slightly smaller than the interior diameter of piping section 32 and may conveniently be mounted therein by means of a flange.

The vessels 8 are designed to have open ends which mate to form a smooth internal surface with the expander 40, and to hold a plurality of wafers 13 or a wafer carrier. A single vessel or plural vessels which meet and interfit may be used. Generally, the vessels are designed such that smooth fluid flow in the direction of axis 38 is promoted. Preferably, no pockets or crevices should be formed by the wafer carrier or wafer support structure.

Referring again to FIG. 2, in the illustrated embodiment, the vessels 8 each include internally disposed wafer support bars 42, an inlet end 44, and an outlet end 46. The inlet of the top vessel 8' is sealingly engaged to the outlet of the expander 40. The inlet of the lower vessel 8" is mated with the outlet of the top vessel 8'. An extractor 48 is sealingly engaged with the outlet 46 of the lower vessel 8".

The illustrated treatment fluid outlet section 10 includes extractor 48 and piping 50 which directs fluid to waste or to apparatus (not shown) for reclamation and subsequent reuse of the treatment fluid.

The seals joining the vessels, expander, and extractor may comprise a structure of interfitting chamfered edges, gaskets, and surfaces of the type disclosed in the interconnecting vessel segments of co-pending U.S. application Ser. No. 612,355. As disclosed in that application, a preferred seal construction bulges slightly inwardly toward the wafers so that pockets where fluid might collect are eliminated. Thus, for example, the expander 40 may have a lower mating edge comprising a beveled surface and elastomeric gasket identical to that of the outlet end 46 of vessels 8' and 8", while extractor 48 may have an upper mating edge comprising a beveled edge and sealing surface identical to the inlet end 44 of the vessels 8' and 8".

Various materials may be used to construct the vessel segments of the invention. One preferred type of material is fluoropolymer such as polytetrafluoroethylene (sold under the trademark "Teflon" by E. I. duPont de Nemours and Company of Wilmington, Del.). The vessel segments should in any case be constructed from a material which is as impervious and inert as possible to the chemical reagents used in the treatment process and as insensitive as possible to any temperature changes during treatment. The sealing gaskets, if gaskets are used, are designed to be able to withstand temperatures up to 150° C. or higher and to be insensitive to the chemicals used in the treatment process. Suitable gasket materials include fluorinated elastomers such as "Kalrez" and "Viton", both of which are manufactured by E. I. duPont de Nemours and Company, or "Fluoraz", manufactured by Greene, Tweed & Co. of North Wales, Pa. It is also preferred that no adhesives be used to fix the gasket in position.

One type of preferred wafer vessel is disclosed in co-pending application Ser. No. 612,355.

Figure 4A:
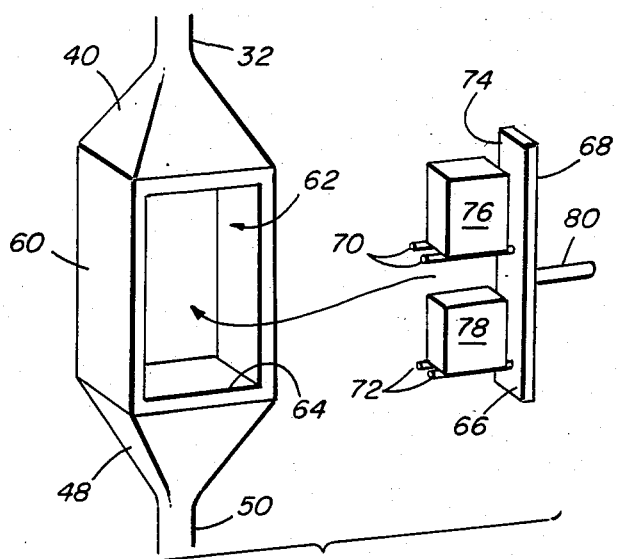
FIGS. 4A, 4B, and 4C are illustrations of the design of various wafer vessels of the type useful in the practice of the invention.
Figure 4B:
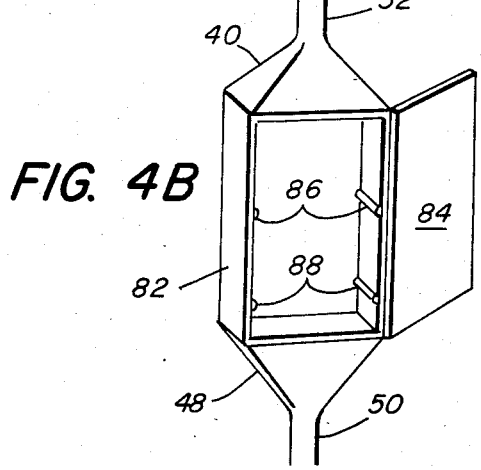
Figure 4C:
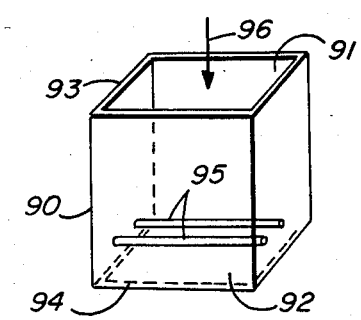

FIGS. 4A, 4B, and 4C schematically illustrate alternative designs for the wafer vessels. The design of FIG. 4A comprises an enclosure 60 made integral with an expander 40 and an extractor 48. One side of the enclosure defines an opening 62 having a seal 64 which interfits with a seal 66 on a panel 68. The panel is fitted with two pairs of wafer carrier support bars 70 and 72 extending perpendicular to its interior face 74. Conventional wafer carriers, depicted schematically at 76, 78, are rested on the support bars when loaded with wafers to be treated, and the panel is then sealed to opening 62 of enclosure 60 by means of handle 80. Preferably, the interior of enclosure 60 or the panel includes structure (not shown) for nesting the wafer carriers 76 and 78 in a selected location and orientation in the enclosure 60.

FIG. 4B depicts another embodiment of a suitable wafer vessel for use in the method and apparatus of the invention. It comprises an enclosure 82, again integrally connected to an expander 40 and extractor 48, having a sealable door 84 and internal structure, e.g., rails 86, 88, for supporting and locating a conventional wafer carrier.

Both of the foregoing structures have advantages in that wafer carriers of the type now commonly in use may be used to handle the wafers, and there is no need for a press or other device for engaging the wafer vessels with the fluid input element 7 and fluid outlet element 10.

FIG. 4C illustrates another design for a wafer vessel useful in the method and apparatus of the invention. It comprises an enclosure 90 having open ends 91, 92, fitted with seals 93 and 94 and a pair of wafer carrier support bars 95. Preferable, as in the embodiments of FIGS. 4A and 4B, structure (not shown) is included in the interior of the vessel which serves to nest the wafer carrier in position as it is lowered in the direction of arrow 96 into the vessel. The exact location and shape of such internal nesting structure necessarily depends on the type of wafer carrier to be used. After a loaded wafer carrier has been positioned within enclosure 90, the vessel is mated with others of identical design, and the stack of vessels or a single vessel is sealingly engaged with an interfitting fluid input element 7 and fluid outlet element 10.

Figure 5A:
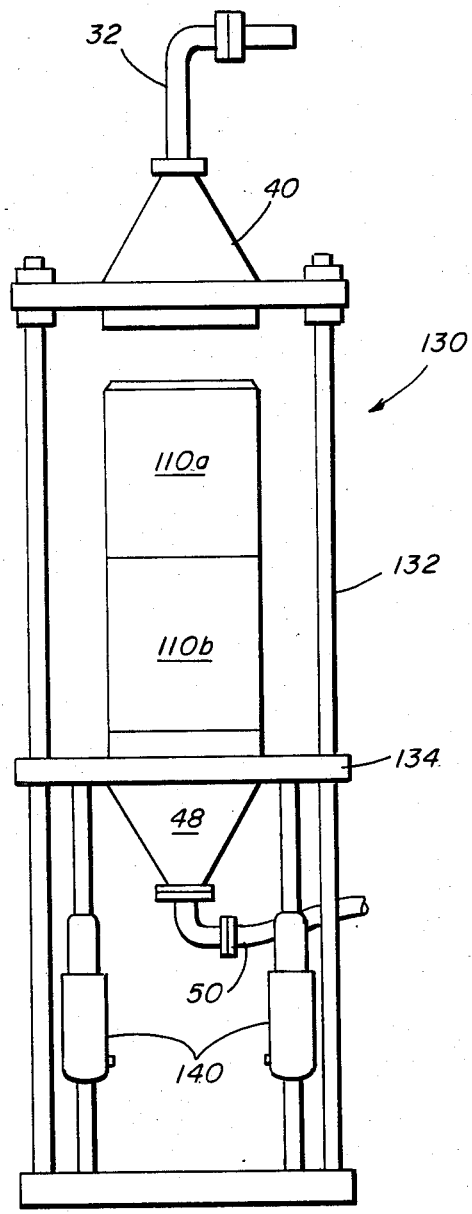
FIGS. 5A and 5B are schematic cross-sectional views of a treatment station constructed in accord with the invention for treating semiconductor wafers with fluids during a wafer-loading stage (FIG. 5A), and a fluid treatment stage (FIG. 5B).
Figure 5B:
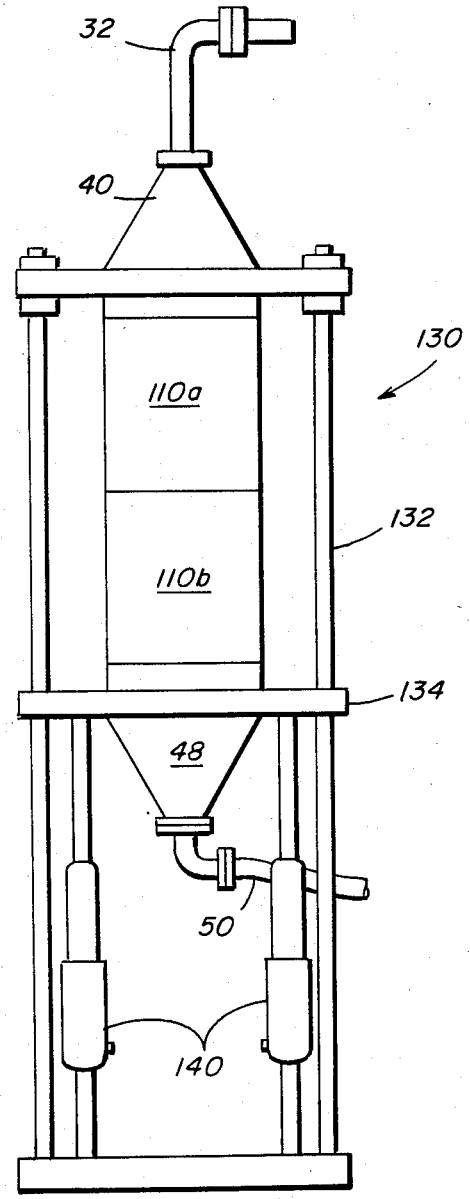

In FIGS. 5A and 5B, a system employing the vessel segments shown in FIG. 2 or FIG. 4C is shown, and its operation is depicted schematically. The system 130 comprises a support structure 132 and a stage 134 upon which a plurality of vessel segments, here illustrated as two segments 110a and 110b, can be stacked or nested together. The vessel segments interconnect as described above and may be positioned in support structure 132 by automatic or robotic controllers. Expander 40 has a lower edge which sealingly engages the inlet of vessel 110a. Extractor 48 has an upper edge which sealingly engages the outlet of the vessel 110b. Further, tubing section 32 includes a flow diverting element of the type disclosed in FIG. 3A or FIG. 3B. Pneumatic cylinders 140 lift the stage 134 (compare FIGS. 5A and 5B) until each of the vessel segments is sealingly interconnected, the uppermost segment 110a is sealed to expander 40, and the lowermost segment 110b is sealed to extractor 48. In the illustrated embodiment, pneumatic cylinders 140 are used so that thermal expansion can be accommodated by the press when hot fluids are used for treatment.

In operation, by way of example, wafers may be cleaned and etched thoroughly and reproducibly in preparation for diffusion by sequential contact with hot sulfuric acid, ultrapure water, a hydrofluoric acid etch solution, an ultrapure water rinse, and a drying step. These reagents are introduced into the vessels through suitable piping and valving which, per se, form no part of this invention. At the outset, sulfuric acid is introduced into the vessels through the extractor 48 and thereafter circulated through the vessels in contact with the wafers. Ozone or another oxidizing agent may be injected into the acid effluent to oxidize impurities. The acid may be removed by introducing pressurized nitrogen through the input element. Thereafter, ultrapure water is circulated through the vessels to remove acid residues from the wafer surfaces and the insides of the wafer vessels and associated piping.

At a point when the rinse effluent from the vessels has a high resistivity and low particle count, indicating that thorough rinsing has been completed, hydrofluoric acid is injected into the flow of ultrapure water to produce an HF solution of precisely defined concentration. The water and hydrofluoric acid are thoroughly mixed as they pass through pipe 12 by static mixer 14. As the leading edge of the HF solution exiting mixer 14 displaced water, a certain amount of mixing occurs. As the acid solution passes through helical flow diverting surface 36, it receives a flow vector transverse to the direction of liquid flow indicated by axis 38. In fluid mechanics terminology, the flow diverting surface 36 imparts angular momentum to the HF solution.

As the HF solution enters expander 40, the angular momentum of the liquid is converted by centrifugal force into lateral momentum. Thus the liquid front tends to expand to fill the increasing cross-sectional area of the expander 40 resulting in an increase in the area of the HF solution-water interface zone. At the point where the fluid begins passing the wafers, most of the rotational velocity has dissipated, and a front defined by the water-HF solution interface zone passes through the vessels with a minimum of turbulent flow. Finally, as the front passes through extractor 48, the vessels are filled with a flow of HF solution which uniformly contacts all radial wafer surfaces.

The etching stage is terminated at a selected time by abruptly ending HF injection while continuing to circulate ultrapure water. The front defined by the trailing edge of the HF solution and the leading edge of the pure water passes through the vessels, again as a plug flow, because of the combined action of the flow diverting surface and the expander.

Because of the plug flow characteristics of the fronts produced on the introduction of the HF solution and the subsequent introduction of pure water, all wafers in a given batch and all wafers in sequential batches receive substantially the same effective exposure to the HF etch solution.

Thereafter, water circulation is continued until the resistivity and particle count of the effluent indicates rinsing is complete. At this point, the water is flushed out with nitrogen. The wafers and interior surfaces of the vessels and associated piping are then dried, for example, by introduction of a hot organic vapor such as methanol, and subsequently displacing the organic vapor with dry nitrogen or other suitable gas. The wafers may then be removed from the vessels for further processing.

It will be clear to those skilled in the art that various changes or adaptations of the invention may be made for particular uses. For example, the system may be used in various other treatment steps besides prediffusion cleaning. The invention can be used in wet processes generally, such as photoresist developing, wet etching, and photoresist stripping. Other applications include diffusion, oxidation, reduction, and sputtering. The apparatus may also be used to dry wafers.

Various changes and modifications can be made to the design of the vessels themselves. In most instances, all dimensions, the number of wafers per vessel, etc., will conform to standards set by the Semiconductor Equipment and Materials Institute as set forth in its *Book of SEMI Standards,* 1983.

In view of the foregoing, it will be apparent that various changes and modifications can be made in the embodiment of the invention without departing from the spirit or scope thereof.

What is claimed is:

1. An apparatus for treating semiconductor wafers with a sequential flow of liquids, said apparatus comprising:
   A. a vessel comprising an enclosure defining a treatment liquid inlet opposed to a treatment liquid outlet, the direction of liquid flow through said enclosure between said inlet and outlet defining an axis;
   B. means for supporting the semiconductor wafers within said enclosure for exposure to the liquid flow through said enclosure; and
   C. a liquid-input element in fluid communication with said treatment liquid inlet comprising means for imparting plug flow to a first liquid being introduced into said enclosure to displace by the plug flow a second liquid already disposed within said enclosure such that the semiconductor wafers are uniformly exposed to the plug flow of liquid through said enclosure.

2. The apparatus of claim 1 wherein said liquid input element comprises means for increasing the area of the flow of said first liquid in a direction transverse to said axis thereby to increase the flow cross-section of said first liquid prior to its introduction into said enclosure.

3. The apparatus of claim 2 wherein said means for imparting plug flow comprises means for imparting to said first liquid a flow vector transverse to said axis.

4. The apparatus of claim 3 wherein said means for imparting plug flow comprises a fixed flow diverting surface.

5. The apparatus of claim 3 wherein said means for imparting plug flow comprises a helical flow diverting surface.

6. The apparatus of claim 5 wherein said helical flow-diverting surface defines an angle of rotation of about 360° about said axis.

7. The apparatus of claim 3 wherein said means for imparting plug flow is disposed upstream of said means for increasing the area of flow.

8. The apparatus of claim 3 wherein said means for imparting plug flow comprises a flow diverting surface mounted for rotation about said axis.

9. The apparatus of claim 3 wherein said means for imparting plug flow comprises a fixed flow diverting surface disposed within an output portion of said means for increasing the area of flow.

10. The apparatus of claim 9 wherein said means for imparting plug flow comprises a perforated baffle structure.

11. The apparatus of claim 1 wherein said vessel further comprises means disposed within said enclosure for supporting a plurality of semiconductor wafers.

12. The apparatus of claim 1 wherein said vessel further comprises means disposed within said enclosure for supporting a wafer carrier.

13. The apparatus of claim 12 further comprising a sealable access port disposed in a wall of said enclosure.

14. The apparatus of claim 1 wherein said vessel and input element comprise interfitting seals for connecting said treatment liquid inlet with said liquid input element.

15. The apparatus of claim 1 further comprising means defining a source of at least one liquid selected from the group consisting of hydrofluoric acid, deionized water, and mixtures thereof, in fluid communication with said liquid input element.

16. The apparatus of claim 1 further comprising a static mixer upstream of said means for imparting plug flow.

17. The apparatus of claim 1 further comprising means for introducing a purge gas into said enclosure.

* * * * *